United States Patent
Hahm et al.

(10) Patent No.: US 7,118,236 B2
(45) Date of Patent: Oct. 10, 2006

(54) LIGHT EMITTING DIODE LENS AND BACKLIGHT APPARATUS HAVING THE SAME

(75) Inventors: Hun Joo Hahm, Kyungki-do (KR); Jung Kyu Park, Seoul (KR); Young June Jeong, Kyungki-do (KR); Young Sam Park, Seoul (KR); Hyung Suk Kim, Kyungki-do (KR); Ho Sik Ahn, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 190 days.

(21) Appl. No.: 10/953,816

(22) Filed: Sep. 30, 2004

(65) Prior Publication Data

US 2006/0034097 A1  Feb. 16, 2006

(30) Foreign Application Priority Data

Aug. 11, 2004 (KR) ............... 10-2004-0063213

(51) Int. Cl.
   *G01D 11/28* (2006.01)
   *F21V 5/00* (2006.01)

(52) U.S. Cl. .................. 362/27; 362/555; 362/97; 362/335; 362/338; 313/512; 257/98

(58) Field of Classification Search ............... 257/95; 313/512; 362/27, 30, 97, 555, 335, 338
See application file for complete search history.

(56) References Cited

U.S. PATENT DOCUMENTS

| | | | |
|---|---|---|---|
| 5,894,196 A * | 4/1999 | McDermott | 313/512 |
| 6,607,286 B1 * | 8/2003 | West et al. | 313/512 |
| 6,679,621 B1 | 1/2004 | West et al. | |
| 2002/0080615 A1 * | 6/2002 | Marshall et al. | 362/338 |

* cited by examiner

*Primary Examiner*—Stephen F Husar
(74) *Attorney, Agent, or Firm*—Lowe Hauptman & Berner, LLP.

(57) ABSTRACT

The present invention relates to an LED lens, in which a planar bottom has a pair of halves symmetrically connected with each other about a reference line and narrowed in the vicinity of the reference line. A pair of substantially semi-circular reflecting surfaces are extended from both edges of the bottom connected with both ends of the reference line. A radiating surface is connected with remaining edges of the bottom and semicircular edges of the reflecting surfaces. The reflecting surfaces reflect light beams are introduced from the LED chip through the bottom toward the radiating surface. The radiating surface radiates the light beams to the outside when the light beams are introduced to the radiating surface through reflection from the reflecting surfaces and directly through the bottom, so that the light beams are radiated to the outside in a predetermined beam angle.

15 Claims, 16 Drawing Sheets

LIGHT EMITTING DIODE LENS AND BACKLIGHT APPARATUS HAVING THE SAME

RELATED APPLICATION

The present application is based on, and claims priority from, Korean Application Number 2004-6321, filed Aug. 11, 2004, the disclosure of which is hereby incorporated by reference herein in its entirety.

BACKGROUND OF THE INVENTION

1. Field of the Invention

The present invention relates to a lens, and more particularly, to a Light Emitting Diode (LED) lens for radiating light from an LED chip in a predetermined beam angle to the outside and a backlight apparatus incorporating the same.

2. Description of the Related Art

A Liquid Crystal Display (LCD) is gaining attention as a next generation display according to the development of the electronic industry. The LCD is generally equipped with a backlight apparatus for illuminating an LCD panel from behind since the LCD panel does not light spontaneously.

FIG. 1 is a cross-sectional view illustrating a conventional LED which is proposed in U.S. Pat. No. 6,679,621 as a light source of a side emitting LCD backlight apparatus. Referring to FIG. 1, an LED 10 includes a plastic package 11 containing a heat conductive material therein, a pair of leads 12 for the input/output of electric signals, an LED chip 14 installed within the plastic package 11 and a lens 13 placed on the frame 11. The lens 13 functions to redirect light beams generated from the LED chip 14 to horizontal directions.

The lens 16 is optically designed so that the light beams, which are generated from the LED chip 14 and propagate in all directions, are refracted horizontally. While FIG. 1 illustrates the lens 13 having a generally mortar-shaped structure, the lens 13 may have more sophisticated structure according to angles of light emitted from the LED chip 14. There is a problem in that some of the light beams maybe uncontrollably directed in a vertical direction rather than being horizontally refracted.

In addition, when an LCD backlight apparatus is realized by using LEDs 10 as above, the LEDs 10 functioning as point light sources are mounted in line on PCBs of a predetermined length to form LED arrays 20 functioning as linear light sources as shown in FIG. 2. The LED arrays 20 are arranged in parallel with each other at a predetermined distance and reflectors 31 are attached to both sides of the LED arrays 20 to form a backlight apparatus 30, in which the reflectors 31 are designed to reflect light beams from the LED arrays 20 in vertical directions.

In the backlight apparatus 30 using the conventional LEDs as described above, since the light beams generated from the light sources or the LED chips 14 are refracted horizontally by the lens 13 and then reflected vertically by the reflectors 31, the light beams change their paths for several times. Therefore, the complicated paths cause light loss.

In addition, since the light beams emitted from the LED chips 14 spread for 360° about optical axes having vertical direction as shown in FIG. 1, their brightness reduces significantly in proportion to the distance from the light sources or the LED chips 14. Therefore, it is required to arrange the LED arrays 20 adjacent to each other in order to prevent brightness reduction.

SUMMARY OF THE INVENTION

The present invention has been made to solve the foregoing problems of the prior art and it is therefore an object of the present invention to provide an LED lens for radiating light from an LED chip in a predetermined beam angle to the outside.

It is another object of the present invention to provide an LED lens which can reduce the number of LED array modules when applied to a backlight apparatus.

It is yet another object of the present invention to provide an LCD backlight apparatus incorporating the above LED lens.

According to an aspect of the invention for realizing the object, there is provided an LED lens for radiating light emitted from an LED chip to the outside comprising: a planar bottom having a pair of halves symmetrically connected with each other about a reference line, and narrowed in the vicinity of the reference line; a pair of substantially semicircular reflecting surfaces extended from both edges of the bottom connected with both ends of the reference line; and a radiating surface connected with remaining edges of the bottom and semicircular edges of the reflecting surfaces, wherein the reflecting surfaces reflect light beams introduced from the LED chip through the bottom toward the radiating surface, and the radiating surface radiates the light beams to the outside, the light beams being introduced to the radiating surface through reflection from the reflecting surfaces and directly through the bottom, whereby the light beams are radiated to the outside in a predetermined beam angle.

Preferably, the reflecting surfaces are curved. Alternatively, each of the reflecting surfaces may include a curved portion connected with the bottom and a planar portion connected with the radiating surface.

Preferably, the pair of reflecting surfaces are symmetric or asymmetric with each other.

Preferably, at least one of the reflecting surfaces is extended from one of the ends of the reference line into the form of a half funnel.

Preferably, the radiating surface has a cross-sectional configuration of a concave curve. Alternatively, the radiating surface may comprise a pair of first linear portions connected with the reflecting surfaces, a pair of opposed second linear portions extended from the first linear portions at a predetermined angle toward the reference line and a convex portion connected with the second linear portions.

Preferably, the radiating surface further comprises linear or curved connecting portions formed between the second linear portions and the convex portion.

Preferably, the second linear portions are substantially parallel with the reference line or inclined at a predetermined angle with respect to the reference line.

Preferably, the bottom is narrowed in the vicinity of the reference line to form a reduced diameter portion, and comprises linear or curved portions at both ends of the reduced diameter portion.

According to an aspect of the invention for realizing the object, there is provided a backlight apparatus provided in a rear part of an LCD for radiating light beams perpendicularly into an LCD panel, comprising: a substantially box-shaped housing opened toward the LCD panel; a reflector inclined slowly upward within the housing; and an LED array including a board extended across the housing and erected on the reflector and at least one LED lens attached on the board for radiating light emitted from an LED chip to the outside. The LED lens comprises: a planar bottom having a pair of halves symmetrically connected with each other about a reference line, and narrowed in the vicinity of the reference line; a pair of substantially semicircular reflecting surfaces extended from both edges of the bottom connected with both ends of the reference line; and a radiating surface connected with remaining edges of the bottom and semicircular edges of the reflecting surfaces, wherein the reflecting surfaces reflect light beams introduced from the LED chip through the bottom toward the radiating surface, and the radiating surface radiates the light beams to the outside, the light beams being introduced to the radiating surface through reflection from the reflecting surfaces and directly through the bottom, whereby the light beams are radiated to the outside in a predetermined beam angle.

Herein the terminology "reflecting surface" represents a lens surface for reflecting light emitted from a light source through total internal reflection obtained by its refractivity and configuration, but does not mean a surface which can reflect all light. The terminology "radiating surface" represents a lens surface for outwardly radiating light which is introduced thereto directly from the light source or as reflected from the reflecting surface. In addition, the terminology "optical axis" represents a specific optical path in a cross section of the lens which is taken along the light source, and the entire lens has optical axes extended in the form of a semicircle.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

A preferred embodiment of the present invention will now be described in detail with reference to the accompanying drawings.

First Embodiment

Figure 3:
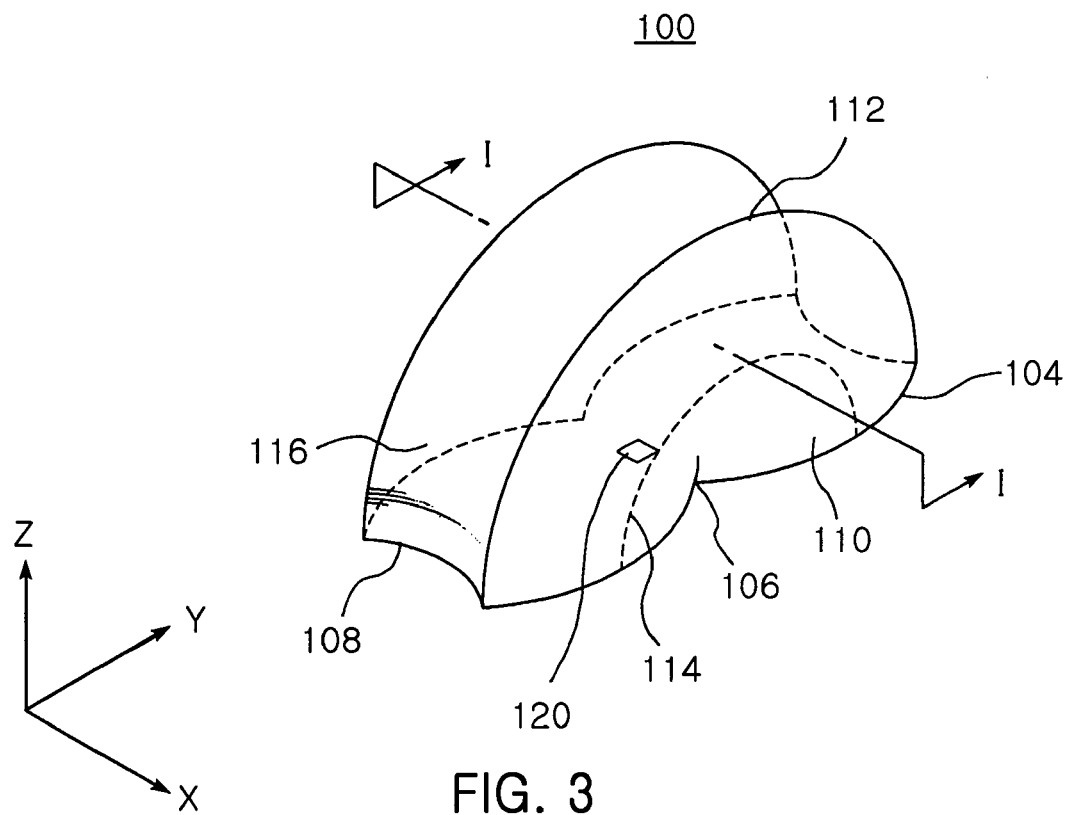
FIG. 3 is a perspective view of an LED lens according to a first embodiment of the present invention.
Figure 4:
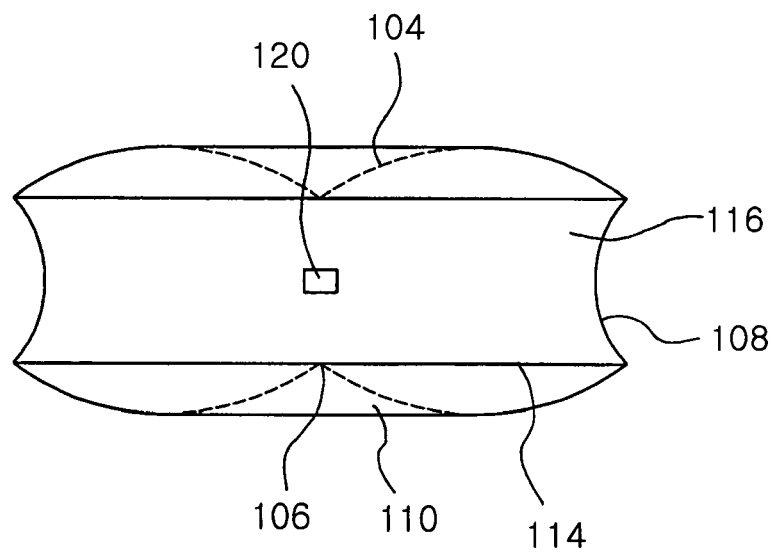
FIG. 4 is a plan view of the LED lens shown in FIG. 3.
Figure 5:
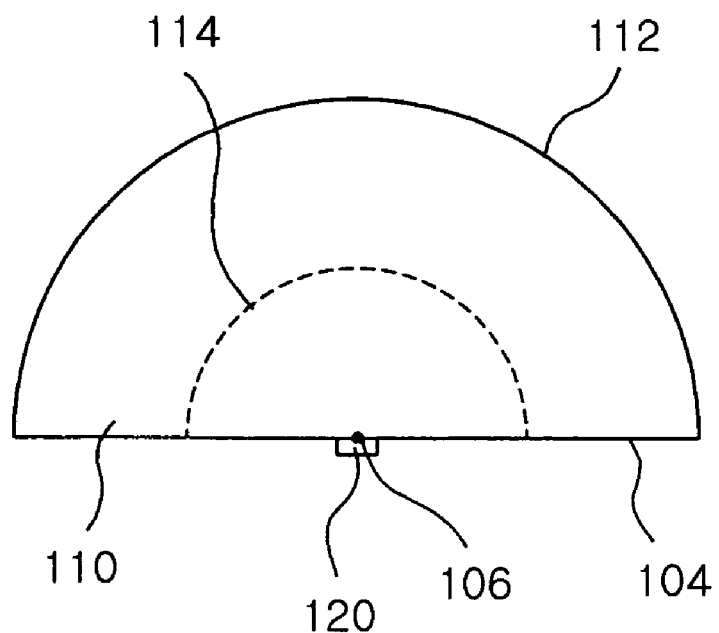
FIG. 5 is a side elevation view of the LED lens shown in FIG. 3.
Figure 6:
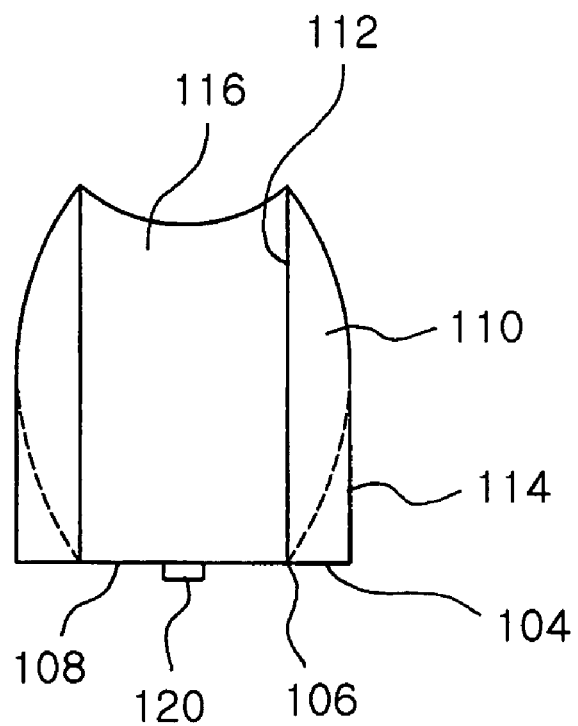
FIG. 6 is a front elevation view of the LED lens shown in FIG. 3.
Figure 7:
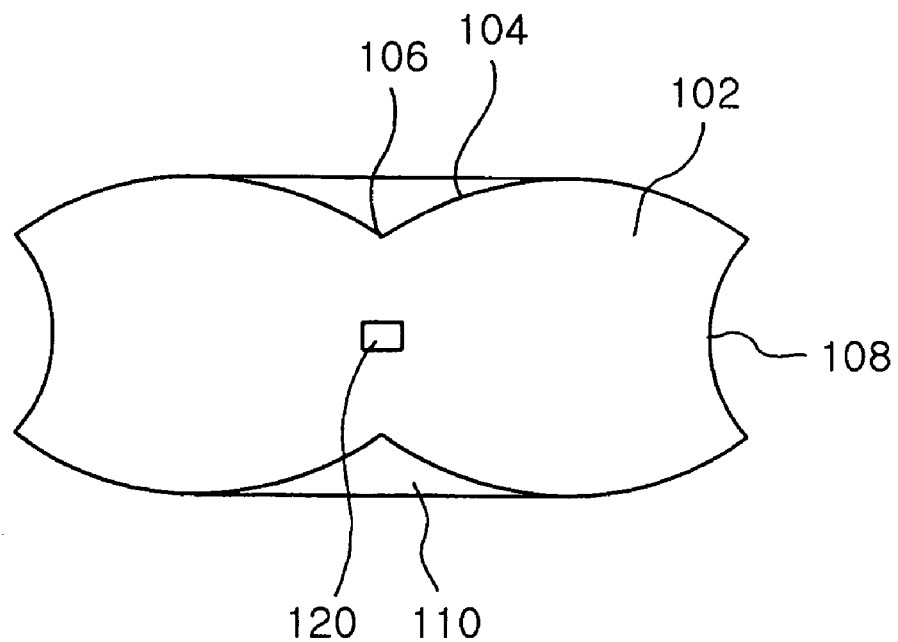
FIG. 7 is a bottom view of the LED lens shown in FIG. 3.
Figure 8:
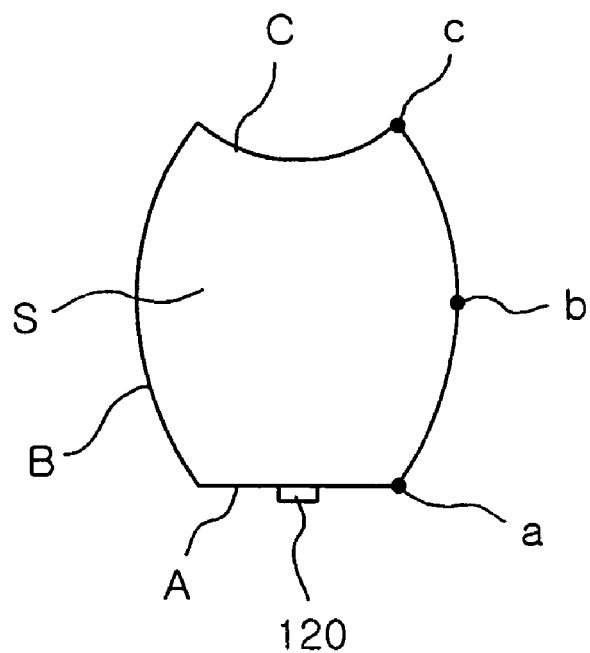
FIG. 8 is a cross-sectional view of the LED lens shown in FIG. 3 taken along the line I—I.

FIGS. 3 to 8 illustrate the structure of an LED lens according to a first embodiment of the present invention, in which FIG. 3 is a perspective view of an LED lens according to a first embodiment of the present invention, FIG. 4 is a plan view of the LED lens shown in FIG. 3, FIG. 5 is a side elevation view of the LED lens shown in FIG. 3, FIG. 6 is a front elevation view of the LED lens shown in FIG. 3, FIG. 7 is a bottom view of the LED lens shown in FIG. 3, and FIG. 8 is a cross-sectional view of the LED lens shown in FIG. 3 taken along the line I—I.

Referring to FIGS. 3 to 8, an LED lens 100 according to the first embodiment of the present invention is made of transparent material, and so configured to radiate light from an underlying LED chip 120 in a specific beam angle to the outside.

The LED lens 100 of this embodiment has a peanut-shaped planar bottom 102, a pair of reflecting surfaces 110 extended upward from the bottom 102 and a radiating surface 116 formed between the bottom 102 and the reflecting surfaces 110. The LED lens 100 also has first edges 104 between the bottom 110 and the reflecting surfaces 110, second edges 108 between the bottom 102 and the radiating surface 116 and third edges 112 between the reflecting surfaces 110 and the radiation surface 116. The LED lens 100 has an overall configuration as is drawn by rotating a cross section S shown in FIG. 8 for 180° around a base line A thereof.

The cross section S shown in FIG. 8 is constituted of the straight base line A, a pair of convex arc-shaped side lines B, which are opposed to each other and extended upward from both ends of the base line A, and a concave arc-shaped top line C drawn between top ends of the side lines B. Herein vertices a formed by the base line A and the side lines B will be referred to as first connecting points whereas vertices b formed by the side lines B and the top line C will be referred to as second connecting points for the convenience's sake of description. In addition, the reference symbol b indicates outermost points on the side lines B which are drawn between the connecting points b and c.

The cross section S of FIG. 8 is taken along the line I—I of FIG. 3 so that the LED lens 100 of FIG. 3 is cut along a straight line drawn between a pair of connecting points 106. The LED lens 100 has a cross-sectional configuration the same as that in FIG. 8 as long as it is taken along the straight line between the connecting points 106, that is, the base line A in FIG. 8, regardless of a radial position which the cross section S passes by.

Hereinafter the structure of the LED lens 100 according to the first embodiment of the present invention will be described in conjunction with the cross-sectional configuration in FIG. 8.

Figure 1:
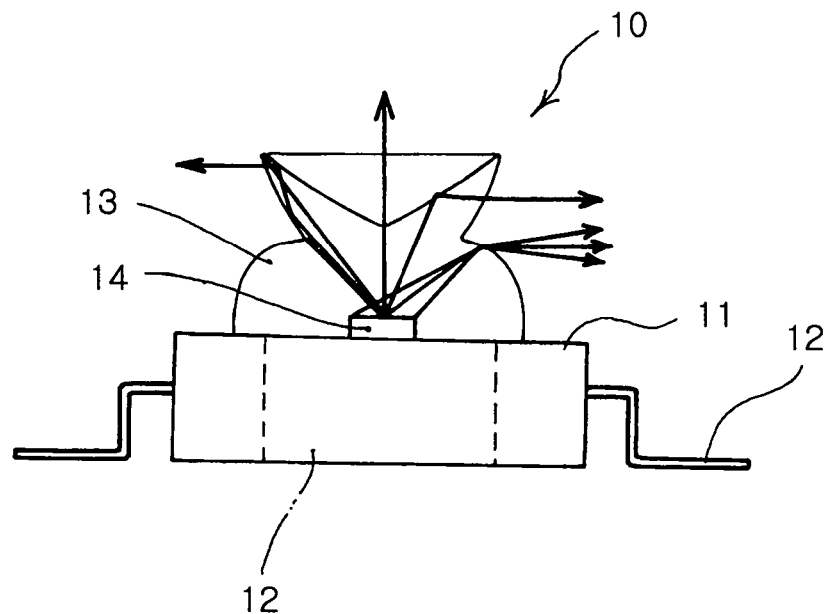
FIG. 1 is a cross-sectional view of a conventional LED lens.
Figure 2:
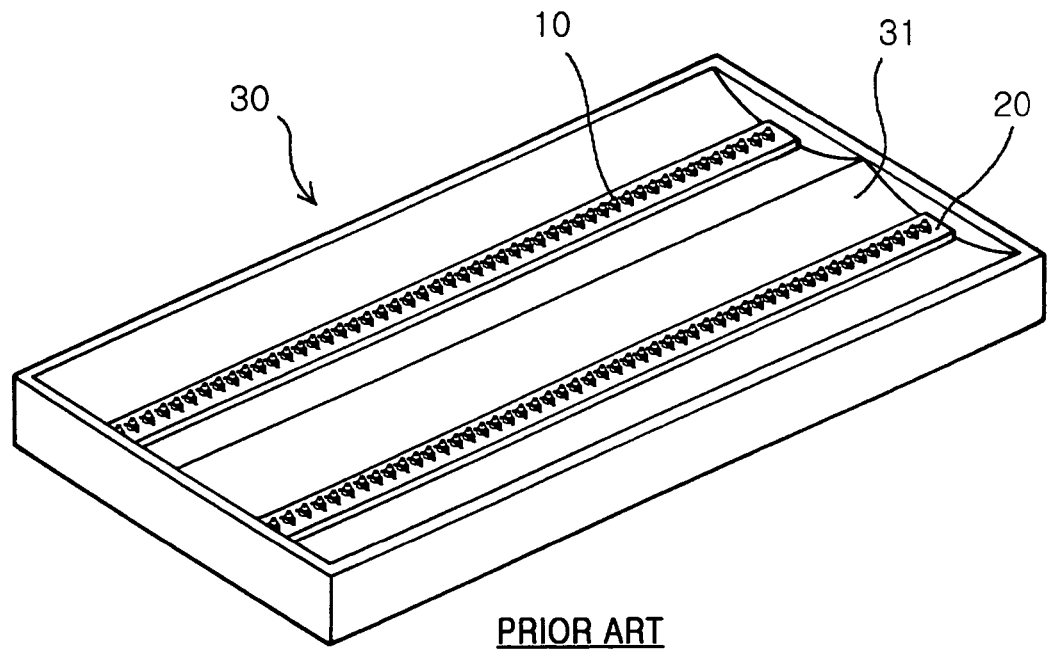
FIG. 2 is a perspective view of a backlight apparatus mounted with LED lens as shown in FIG. 1.

First, as illustrated more specifically in FIG. 7, the bottom 102 is delineated by the pair of first edges 104, which are opposed to each other and extended along the length of the bottom 102, and the pair of opposed second edges 108, which are extended to connect both ends of the first edges 104. The second edges 108 are formed shorter than the first edges 104. The bottom 102 is configured the same as that obtained by coupling two cross sections S as shown in FIG. 2 together about the base line A. The respective first edges 104 have a configuration obtained by connecting a pair of convex arcs together in an opposed way about the connecting point 106. Each first edge 104 is produced by connecting two side lines B as shown in FIG. 8 together. On the contrary, the second edges 108 have a concave configuration the same as the top line C of FIG. 8.

The reflecting surfaces 110 have a configuration the same as that drawn by the opposed side lines B when the cross section S of FIG. 8 is rotated for 180° about the base line A. That is, the reflecting surfaces 110 are formed between the first edges 104 and the third edges 112 drawn by the second connecting points c. When seen along the x axis in FIG. 3, the reflecting surfaces 110 have a semicircular configuration (as more specifically illustrated in FIG. 5). Also, when seen along the y axis in FIG. 3, arcs 114 of dotted lines, which are drawn by the outermost connecting points b of the cross section S, are positioned at the top and the third edges 112 and the connecting points 106 are positioned at the bottom of the reflecting surfaces 110. In this case, regions of the reflecting surfaces 110 between the arcs 114 and the connecting points 106 are generally shaped as the half of a funnel.

In addition, the radiating surfaces 116 are delineated by the second edges 108 and the third edges 112, respectively, and correspond to a locus drawn by the top line C of the cross section S in FIG. 8.

While it has been described that the lens 100 has an integral solid structure, a portion of the lens 100 over the LED chip 120 may be filled with transparent resin such as silicone that has a refractivity substantially the same as or similar to that of the lens 100.

Figure 9:
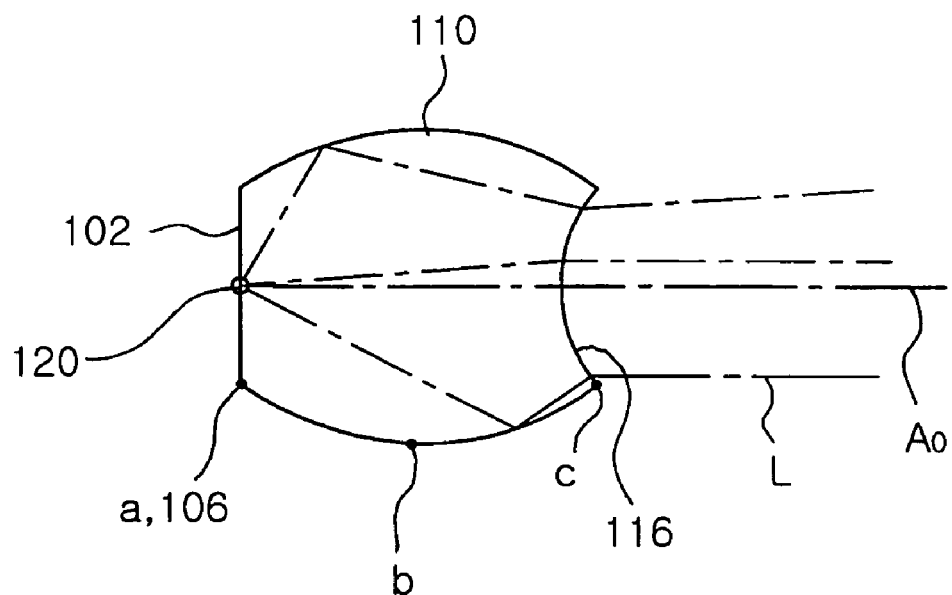
FIG. 9 is a cross-sectional view illustrating beam angle characteristics of the LED lens according to the first embodiment of the present invention.
Figure 10:
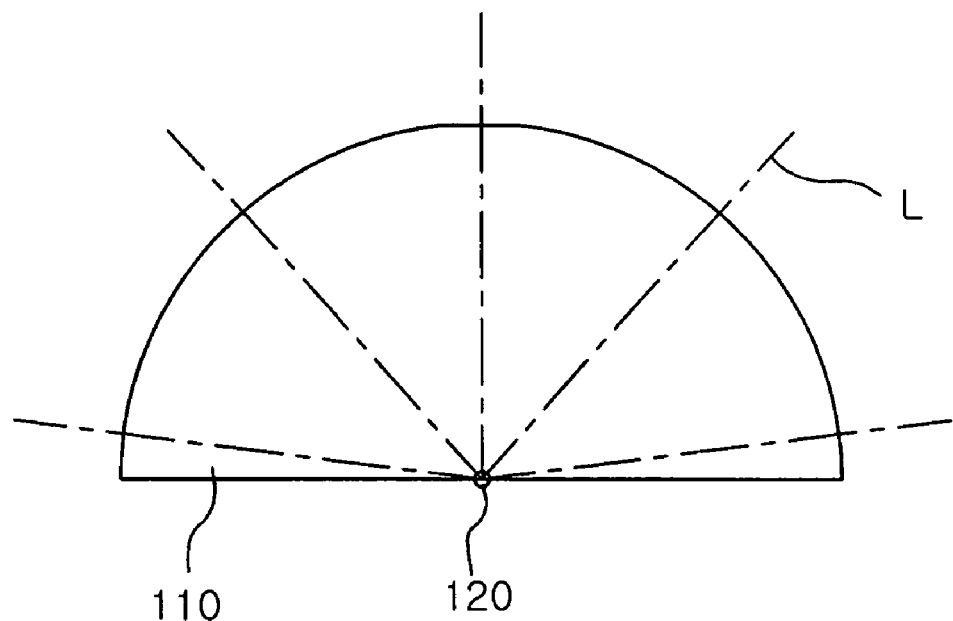
FIG. 10 is a cross-sectional view illustrating beam angle characteristics of the LED lens according to the first embodiment of the present invention.
Figure 11:
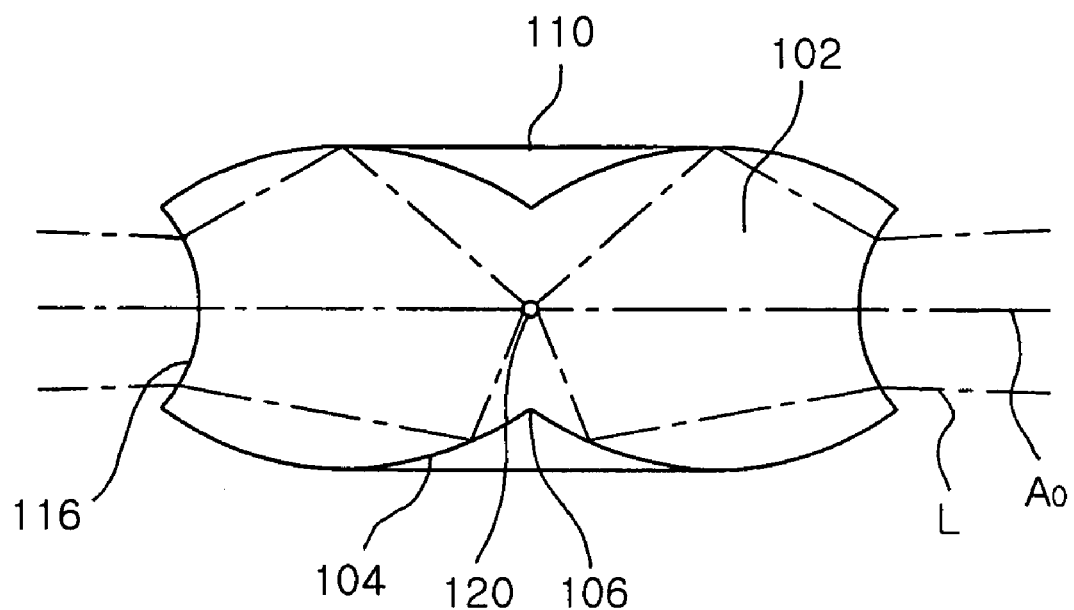
FIG. 11 is a bottom view illustrating beam angle characteristics of the LED lens according to the first embodiment of the present invention.

As described above, the LED lens 100 is designed to radiate light from the LED chip 120 in a predetermined beam angle to the outside, as will be described hereinafter with reference to FIGS. 9 to 11, in which FIG. 9 illustrates beam angle characteristics in the cross section S of the LED lens 100 according to the first embodiment of the present invention, FIG. 10 is a plan view illustrating beam angle characteristics of the LED lens 100 according to the first embodiment of the present invention, and FIG. 11 illustrates beam angle characteristics in the bottom 102 of the LED lens 100 according to the first embodiment of the present invention.

Referring FIG. 9 first, light beams L emitted from the LED chip 120, which is expressed as a point light source for the convenience's sake, are radiated in part directly through the radiating surfaces 116 to the outside. Parts of the light beams L are reflected from the reflecting surfaces 110, and then radiated to the outside through the radiating surfaces 116. Herein a light path $A_o$ directed perpendicularly forward from the LED chip 120 will be referred to as "optical axis" for the convenience's sake. Since the cross-sectional configuration as in FIG. 9 exists for 180° about a line between the connecting points 106 or the base line A in the entire LED lens 100, the optical axis $A_o$ also exists for about 180° and therefore draws a semicircle.

In this case, partial regions of the reflecting surfaces 110 from the first connecting points a to the second connecting points b (hereinafter will be referred to as "first reflecting surface regions") are so designed to reflect beams L from the LED chip 120 through total internal reflection. The configuration of the reflecting surfaces 110 between the first and second connecting points a and b is determined based upon the refractivity of the lens 100 and that of the external environment (i.e., the air in general). In the meantime, partial regions of the reflecting surfaces 110 from the second connecting points b to the third connecting points c (hereinafter will be referred to as "second reflecting surface regions") are not necessarily required to reflect the entire light beams L. The second reflecting surface regions may be optionally configured to radiate the light beams L by refracting the same toward the optical axis $A_o$.

Alternatively, the second reflecting surface regions between the connecting points b and c may be formed in parallel with the optical axis $A_o$.

This configuration is designed on the basis of the fact that those surfaces extended from the second connecting points b in parallel with the optical axis $A_o$ can reflect the light beams L through total internal reflection as long as the light beams L from the LED chip 120 are reflected from the second connecting points b through total internal reflection.

The radiating surface 116 outwardly radiates the beams L that are incident to the radiating surface 116 directly from the LED chip 120 and through reflection from the reflecting surfaces 110. In this case, since the radiating surface 116 is concave, the beams L tend to spread out rather than to converge toward the optical axis $A_o$ when they are radiated to the outside. The beams L are radiated to the outside in the range of a predetermined beam angle with respect to the optical axis, the beam angle is determined by the configuration of the lens 100, and more particularly, the configuration of the reflecting and radiating surfaces 110 and 116 and the refractivity of the lens 100.

When seen in the x-axial direction of FIG. 3, the beams L emitted from the LED chip 120 propagate radially from the light source as shown in FIG. 10. Since the radiating surface 116 is configured the same as the locus drawn by the top line C when the cross section S of FIG. 8 is rotated for 180° about the base line A as described hereinbefore, respective points of the radiating surface 116 on the same plane are spaced equally from the point light source of the LED chip 120. In this case, the LED chip 120 is placed at the center of a circle, and the radiating surface 116 draws a semicircle. Therefore, when seen on a plane, the beams L emitted from the LED chip 120 are perpendicularly incident into the radiating surface 116 and therefore radiated to the outside without reflection or refraction.

Referring to FIG. 11, the reflection and radiation at the bottom 102 of the LED lens 100 is substantially the same as that in FIG. 9. The reflection and radiation at the bottom 102 of the LED lens 100 is substantially the same as that in FIG. 9. In addition, since the bottom 102 has a configuration obtained by coupling two of the cross section S together about the base line A, the light beams L are radiated to the right and left in the drawing from the LED chip 120 that is a point light source.

Accordingly, when the LED lens 100 of this embodiment radiates the light beams L emitted from LED chip 120 to the outside, the LED lens 100 radiates y- and z-axial components of the light beams in radial directions as they are but redirects x-axial components thereof in y- and/or z-axial directions. As a result, when radiated to the outside through the radiating surface 116 of the LED lens 100, the light beams L are refracted within the predetermined beam angle about the optical axis $A_o$ while spreading in the radial directions. The range of beam angle is determined by the configuration and refractivity of the LED lens 100. For example, shaping the reflecting surfaces 110 asymmetrical may create an asymmetric beam angle.

The LED lens 100 of this configuration forms simpler optical paths compared to the conventional LED lens 10 so as to reduce light loss.

Hereinafter a backlight apparatus incorporating LED lenses of the present invention will be described with reference to FIG. 12.

Figure 12:
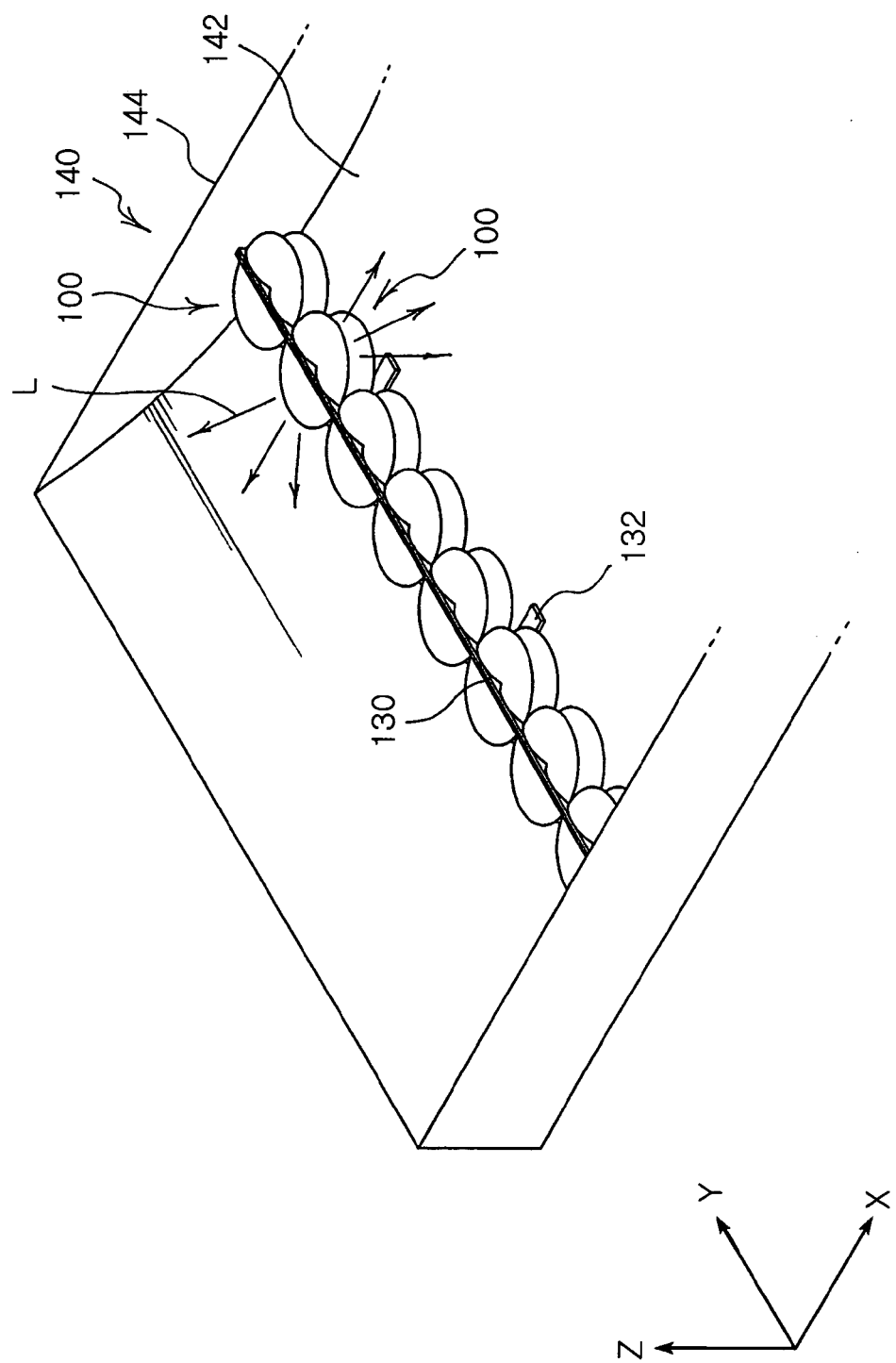
FIG. 12 is a perspective view illustrating a portion of a backlight apparatus having LED lenses of the present invention.

As shown in FIG. 12, a backlight apparatus 140 is designed to radiate light perpendicularly to an LCD panel (not shown) from a rear part of an LCD (not shown). The backlight apparatus 140 includes a substantially box-shaped housing 144 opened toward the LCD panel, a reflector 142 extended along a slow upward inclination within the housing 144 and an LED array 130 extended across the housing and erected on the reflector 142. The reflector 142 is extended along the plane of the housing 144, that is, the x-axial direction in the drawing. The reflector 142 is also inclined slowly upward in a vertical direction, that is, the z-axial direction. The LED array 130 is placed in a lowermost part of the reflector 142, and includes a number of LED chips (not shown) attached to both sides of a bar-shaped board (e.g., typically PCB), a number of LED lenses 100 surrounding the LED chips, respectively, and a bracket 132 for fixing the LED array 130 to the reflector 142.

This causes light beams L radiated from the LED array 130 propagate inside the backlight apparatus 140 in a predetermined beam angle. That is, the light beams L spread out in the plane direction of the backlight apparatus 140 but do not spread out beyond a predetermined vertical angle. The beams L are mixed together while propagating along the plane of the backlight apparatus 140, and then the mixed beams reflect from the reflector 142 toward the LCD panel so as to backlight the LCD panel.

This structure allows one LED array 130 to be mounted with more LED lenses and chips, which are doubled compared to the foregoing prior art, thereby increasing light quantity radiated from the LED array 130. Accordingly, this structure can reduce the number of LED arrays 130, thereby simplifying the structure of the backlight apparatus 140.

Figure 13:
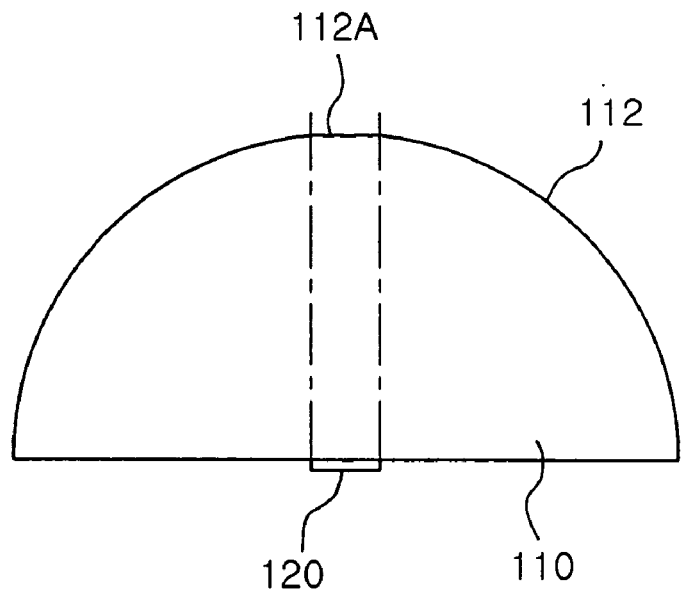
FIG. 13 is a plan view of a modification to the LED lens according to the first embodiment of the present invention.

FIG. 13 is a plan view of a modification to the LED lens according to the first embodiment of the present invention. Referring to FIG. 13, an LED lens 100A according to this modification has linear portions 112A formed in partial regions of third edges 112 opposed to an LED chip 120. The linear portions 112A have a length the same as that of the LED chip 120. Also, a linear region of an equal configuration is formed in a corresponding portion of a radiating surface (not shown). The LED lens 100A of this configuration can be suitably applied especially if the LED chip 120 is long.

Figure 14:
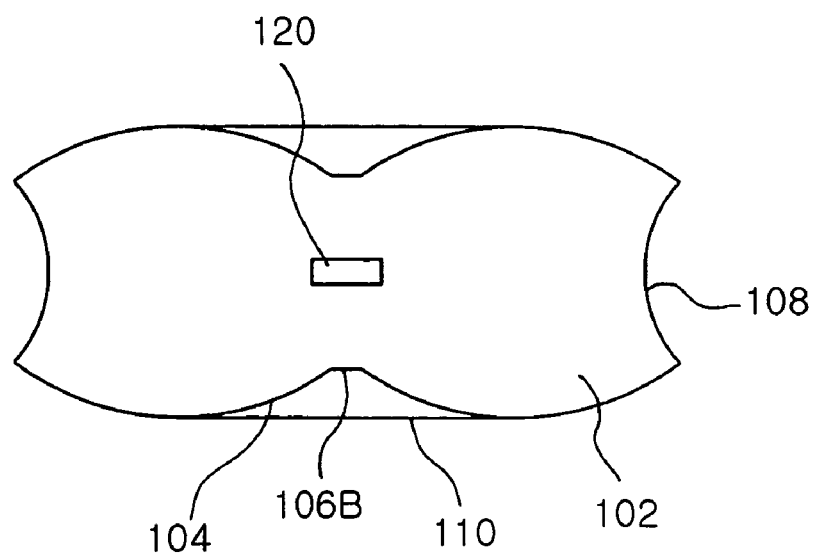
FIG. 14 is a bottom view of another modification to the LED lens according to the first embodiment of the present invention.

FIG. 14 is a bottom view of another modification to the LED lens according to the first embodiment of the present invention. Referring to FIG. 14, an LED lens 100B according to this modification is substantially the same as the LED lens as shown in FIGS. 3 to 8 except that linear connecting parts 106B are formed in the middle of first edges, respectively. The linear connecting parts 106B facilitate the fabrication of a mold for forming the lens 100B. Alternatively, the connecting parts may be curved.

The LED lens according to the first embodiment of the present invention are not limited to the afore-described illustrative structures 100, 100A and 100B. For example, the radiating surfaces are not necessarily symmetric. In this case, the foregoing connecting point 106 or the connecting part 106B may be formed only in one of the reflecting surfaces 110 so that the opposite one of the reflecting surfaces 110 may not be half funnel shaped.

Second Embodiment

Figure 15:
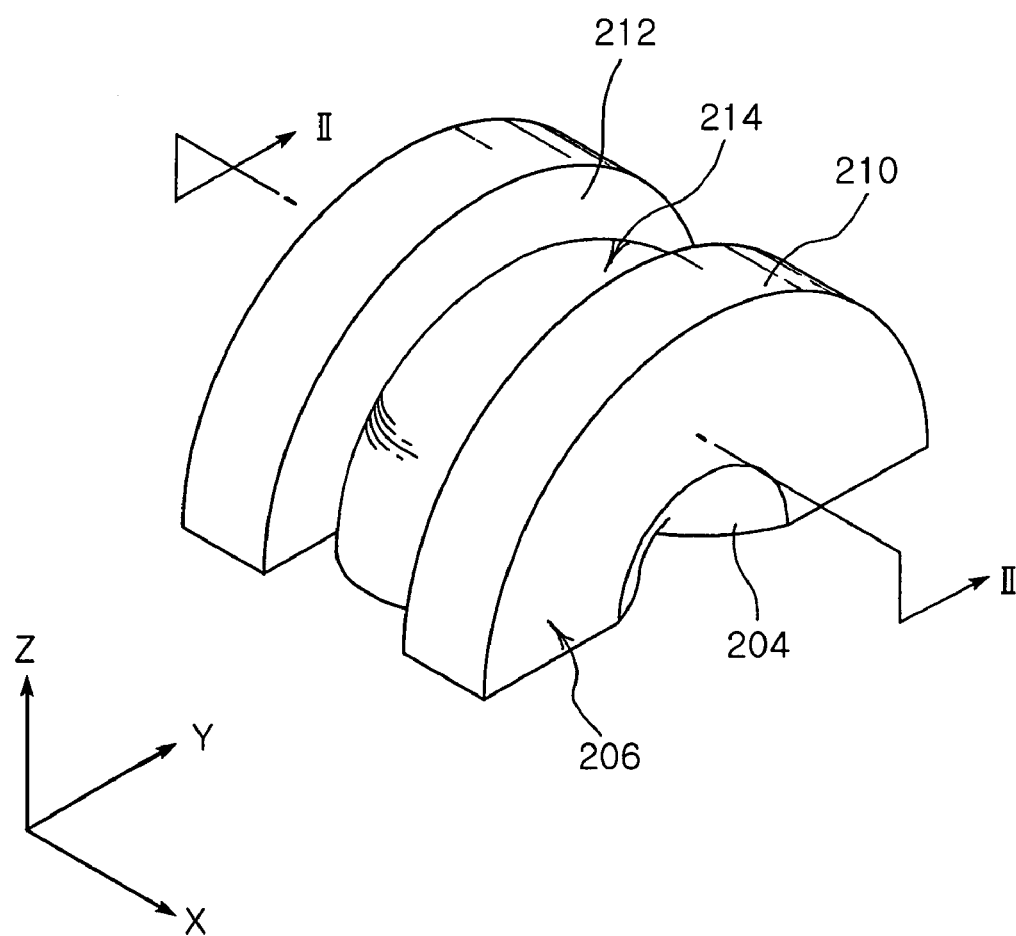
FIG. 15 is a perspective view of an LED lens according to a second embodiment of the present invention.
Figure 16:
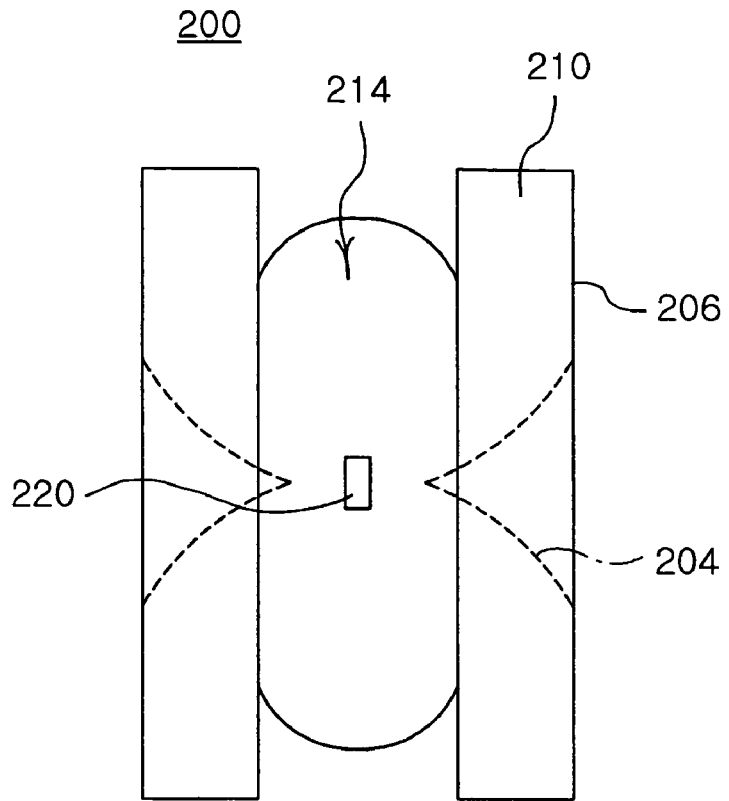
FIG. 16 is a plan view of the LED lens shown in FIG. 15.
Figure 17:
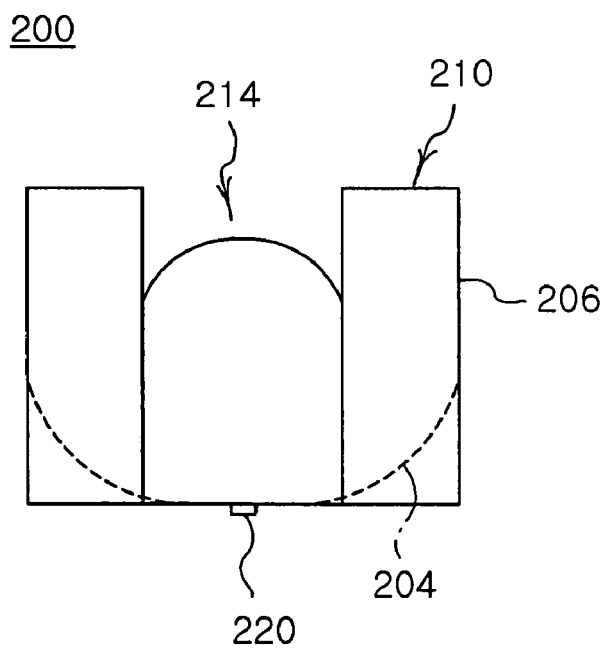
FIG. 17 is a front elevation view of the LED lens shown in FIG. 15.
Figure 18:
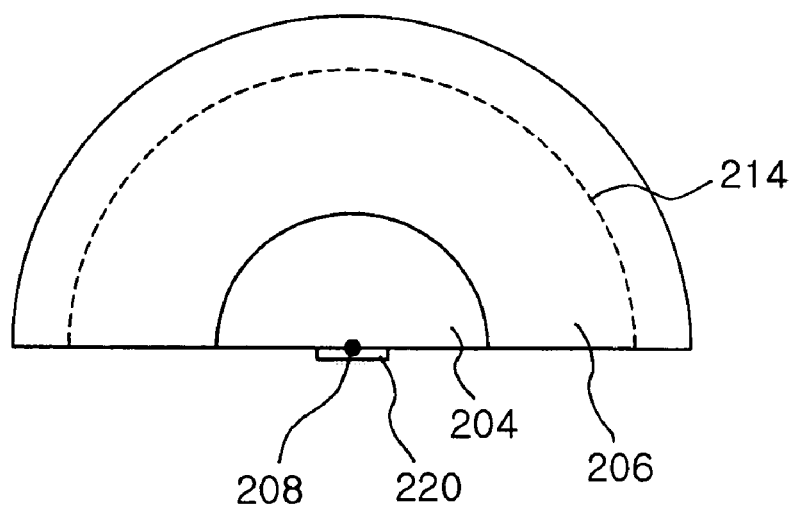
FIG. 18 is a side elevation view of the LED lens shown in FIG. 15.
Figure 19:
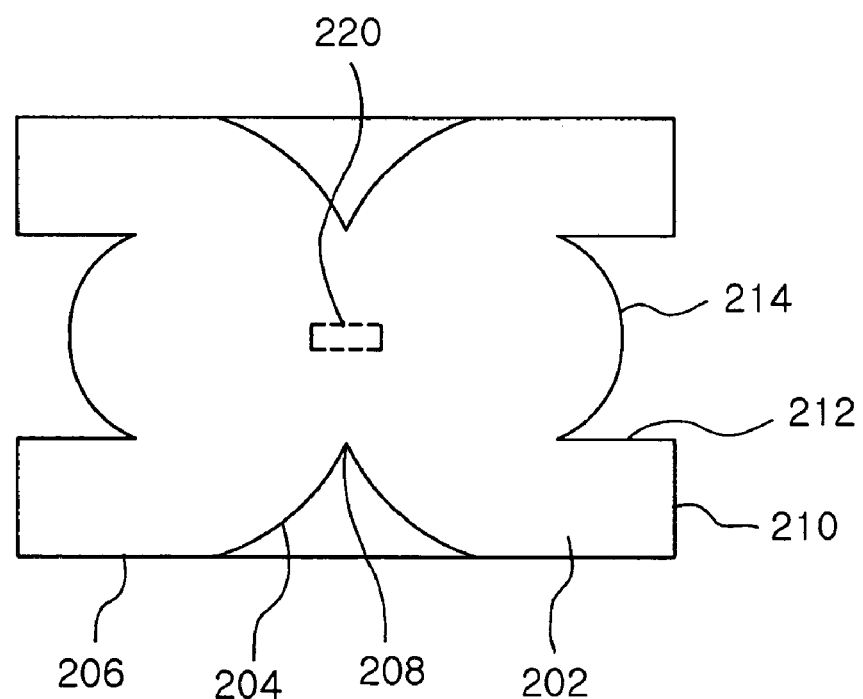
FIG. 19 is a bottom view of the LED lens shown in FIG. 15.
Figure 20:
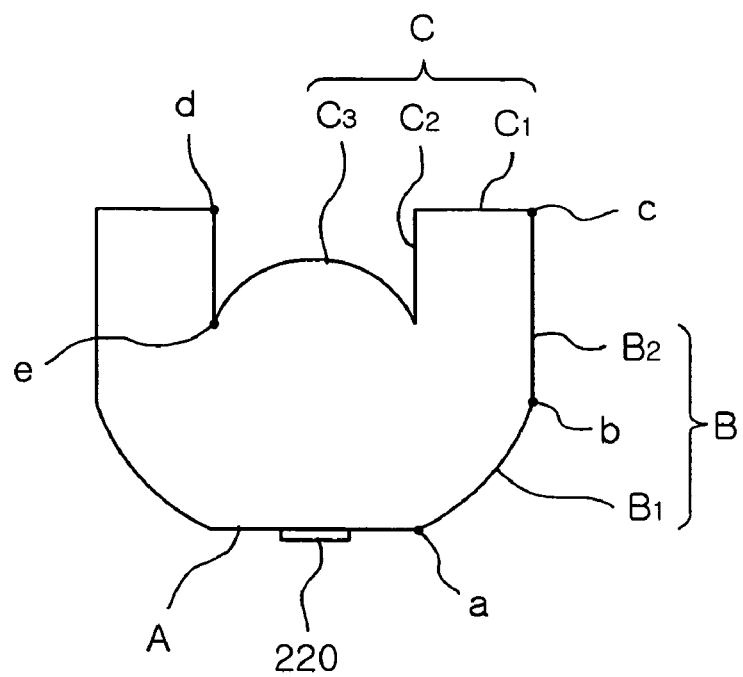
FIG. 20 is a cross-sectional view of the LED lens shown in FIG. 15 taken along the line II—II.

FIGS. 15 to 20 illustrate the structure of an LED lens according to a second embodiment of the present invention, in which FIG. 15 is a perspective view of the LED lens according to the second embodiment of the present invention, FIG. 16 is a plan view of the LED lens shown in FIG. 15, FIG. 17 is a front elevation view of the LED lens shown in FIG. 15, FIG. 18 is a side elevation view of the LED lens shown in FIG. 15, FIG. 19 is a bottom view of the LED lens shown in FIG. 15, and FIG. 20 is a cross-sectional view of the LED lens shown in FIG. 15 taken along the line II—II.

Referring to FIGS. 15 to 20, an LED lens 200 according to the second embodiment of the present invention is made of transparent material, and so configured to radiate light from an LED chip 220, which is placed in the bottom thereof, in a specific beam angle to the outside.

The LED lens 200 of this embodiment includes a planar bottom 202 in the form of opposed crowns, a pair of first and second reflecting surfaces 204 and 206 extended upward from the bottom 202, first and second radiating surfaces 210 and 214 and intermediate surfaces 212. The radiating surfaces 210 and 214 and the intermediate surfaces 212 are formed between the bottom 202 and the second reflecting surfaces 206. The LED lens 200 has a general configuration the same as that drawn by rotating a cross section S shown in FIG. 20 for 180° around a base line A thereof.

The cross section S shown in FIG. 20 is constituted of the straight base line A, a pair of convex arc-shaped first side lines B1 extended upward from both ends of the base line A in an opposed fashion, a pair of straight second side lines B2 extended upward from the first side lines B1, a pair of straight first top lines C1 extended inward from top ends of the second side lines B2, a pair of straight second top lines C2 extended downward from inner ends of the first top lines C1 and a convex arc-shaped third top line connecting between bottom ends of the second top lines C2. Herein, for the convenience's sake of description, vertices a formed by the base line A and the first side lines B1 will be referred to as first connecting points, vertices b formed by the first and second side lines B1 and B2 will be referred to as second connecting points, vertices c formed by the second side lines B2 and the first top lines C1 will be referred to as third connecting points, vertices d formed be the first top lines C1 and the second top lines C2 will be referred to as fourth connecting points, and vertices e formed by the second top lines C2 and the third top line C3 will be referred to as fifth connecting points.

The cross section S of FIG. 20 is taken along the line II—II of FIG. 15 so that the LED lens 200 of FIG. 15 is cut along a straight line drawn between a pair of connecting points 208. The LED lens 200 has a cross-sectional configuration the same as that in FIG. 20 as long as it is taken along the straight line between the connecting points 208, that is, the base line A in FIG. 20, regardless of a radial position which the cross section S passes by.

Hereinafter the structure of the LED lens 200 according to the second embodiment of the present invention will be described in conjunction with the cross-sectional configuration in FIG. 20.

As described above, the LED lens 200 has a configuration the same as a locus drawn by rotating the cross section S of FIG. 20 about the base line A for 180°.

First, the bottom 202 as specifically shown in FIG. 19 has a configuration the same as that obtained by rotating the cross section S of FIG. 20, that is, coupling two cross sections S together about the base line A.

The reflecting surfaces 204 and 206 have a configuration the same as a locus drawn by the opposed first and second side lines B1 and B2 when the cross section S of FIG. 20 is rotated about the base line A for 180°. That is, the first reflecting surfaces 204 correspond to loci drawn by the first side lines B1 between the first and second connecting points a and b of the cross section S of FIG. 20, the second reflecting surfaces 206 correspond to loci drawn by the second side lines B2 connecting between the second and third connecting points b and c. Accordingly, the respective first reflecting surfaces 204 have an overall configuration corresponding to the half of a funnel, and the connecting points 208 correspond to vertices of funnels.

Further, the radiating surfaces 210 and 214 and the intermediate surfaces 212 are drawn by the top lines C1, C2 and C3 of the cross section S of FIG. 20, respectively.

While it has been described that the lens 200 has an integral solid structure, a portion of the lens 200 over the LED chip 220 may be filled with transparent resin such as silicone that has a refractivity substantially the same as or similar to that of the lens 200.

Figure 21:
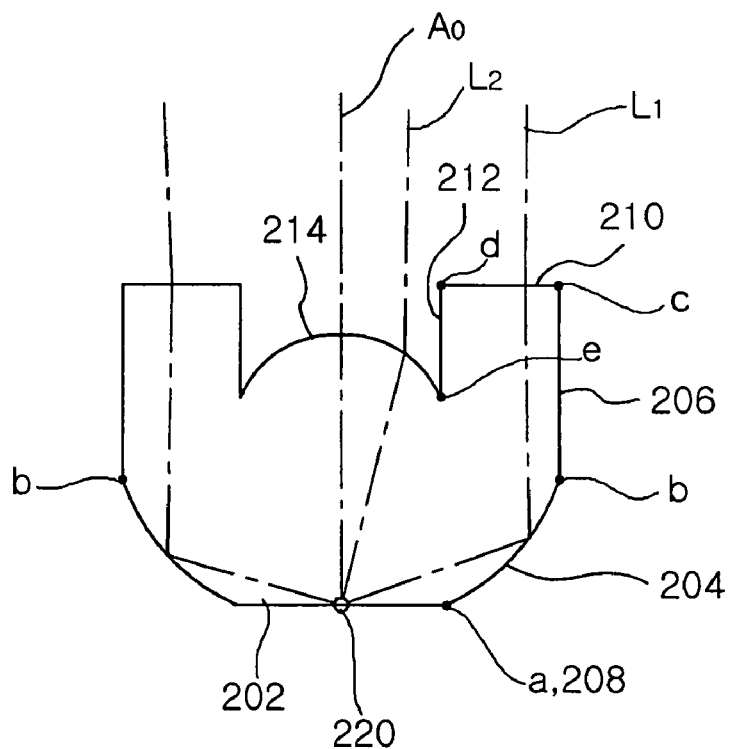
FIG. 21 is a cross-sectional view illustrating beam angle characteristics of the LED lens according to the second embodiment of the present invention.
Figure 22:
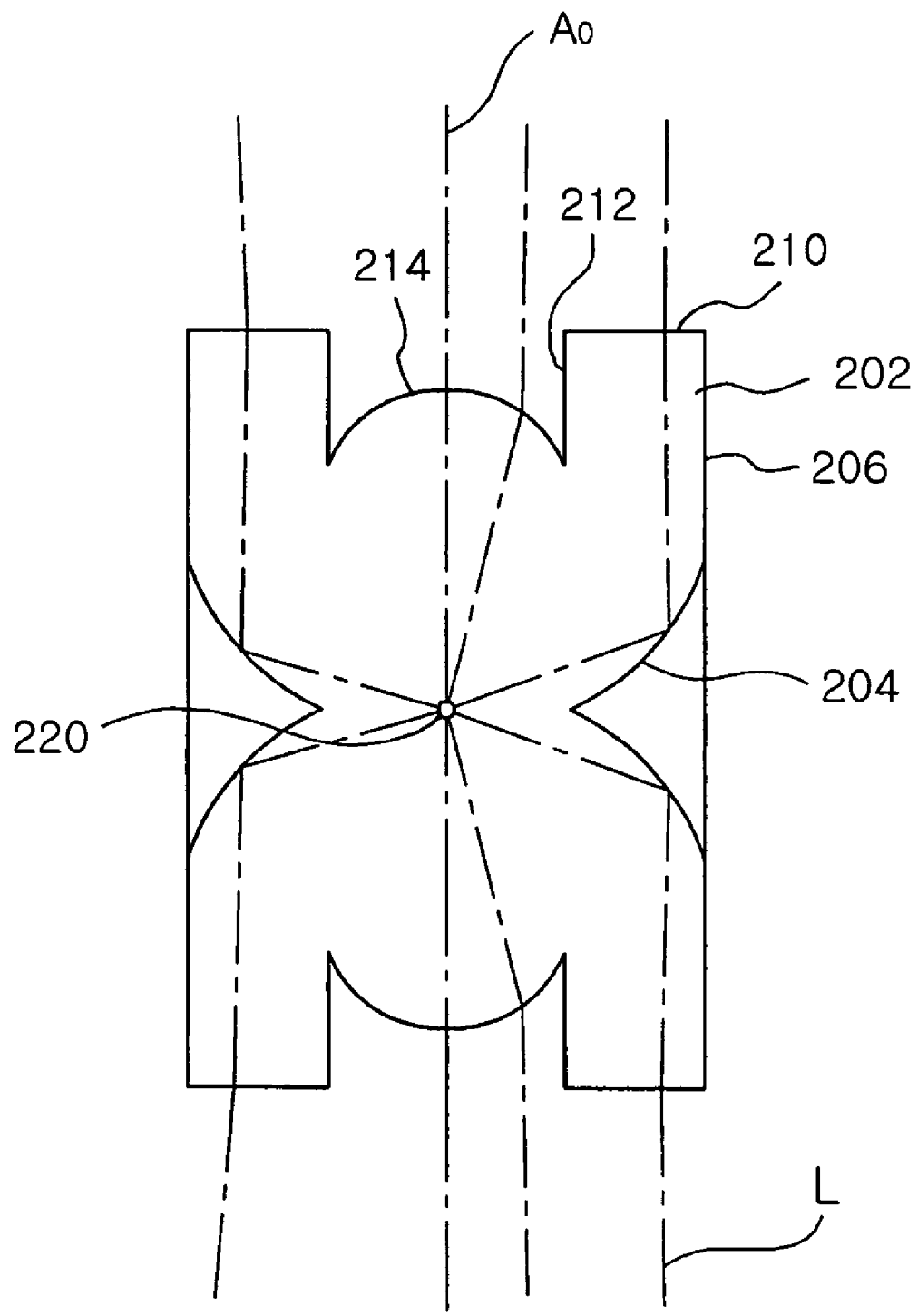
FIG. 22 is a bottom view illustrating beam angle characteristics of the LED lens according to the second embodiment of the present invention.

As described above, the LED lens 200 is designed to radiate light from the LED chip 220 in a predetermined beam angle to the outside, as will be described hereinafter with reference to FIGS. 21 and 22, in which FIG. 21 is a cross-sectional view illustrating beam angle characteristics in the cross section S of the LED lens 200 according to the second embodiment of the present invention, and FIG. 22 is a bottom view illustrating beam angle characteristics in the bottom 202 of the LED lens according to the second embodiment of the present invention.

Referring to FIG. 21 first, light beams L emitted from the LED chip 220, which is expressed as a point light source for the convenience's sake, are radiated in part directly through the first and second radiating surfaces 210 and 214 to the outside. Parts of the light beams L-are reflected from the reflecting surfaces 204 and 206, and then radiated to the outside through the radiating surfaces 210 and 214. In this case, a light path $A_o$ directed perpendicularly forward from the LED chip 220 will be referred to as "optical axis" for the convenience's sake.

In this case, partial regions of the reflecting surfaces 204 and 206 are so configured that the first reflecting surfaces 204 between the first and second connecting points a and b reflect the light beams L emitted from the LED chip 220 via total internal reflection. The configuration of the first reflecting surfaces 204 is determined based upon the refractivity of the lens 200 and that of the external environment (i.e., the air in general). In the meantime, the second reflecting surfaces 206 from the second connecting points b to the third connecting points c are not necessarily required to reflect the entire light beams L. The second reflecting surfaces 206 maybe optionally configured to radiate the light beams L by refracting the same toward the optical axis $A_o$.

The radiating surfaces 210 and 214 outwardly radiate a light beam L1 reflected from the reflecting surfaces 204 and a light beam L2 introduced directly from the LED chip 220. The second radiating surface 214 outwardly radiates the light beam L2 directly introduced from the LED chip 220, and owing to its convex geometry, serves to focus the light beam L2 toward the optical axis $A_o$. In the entire LED 200, since the cross section S as shown in FIG. 21 exists for 180° about the base line A or a straight line between the connecting points 208, the optical axis $A_o$ also forms a semicircle of 180°.

The light beams L are radiated to the outside in a predetermined beam angle with respect to the optical axis, and the beam angle is determined by the refractivity of the lens 200 and the configuration of the lens 200 such as the reflecting surface 204 and 206, the radiating surfaces 210 and 214 and the intermediate surfaces 212.

Referring to FIG. 22, the reflection and radiation at the bottom 202 of the LED lens 200 is substantially the same as that in FIG. 21. In addition, since the bottom 202 has a configuration obtained by coupling two of the cross section S together about the base line A, the light beams L are radiated to the right and left in the drawing from the LED chip 220 that is a point light source.

As not shown in the drawings, when emitted from the LED chip 220 in a radial direction of the LED diode 200, that is, the y- and z-axial directions of FIG. 15, the light beams propagate radially from the light source as previously described in the first embodiment with reference to FIG. 10. As shown in FIG. 18, since the LED lens 200 has a semicircular configuration in a plane seen in the x-axial direction, the light beams emitted from the LED lens 220 are radiated to the outside without reflection or refraction in the y- or z-axial direction.

Accordingly, when the LED lens 200 of this embodiment radiates the light beams L emitted from LED chip 220 to the outside, the LED lens 200 radiates y- and z-axial components of the light beams in radial directions as they are but redirects x-axial components thereof in y- and/or z-axial directions. As a result, when radiated to the outside through the radiating surfaces 210 and 214 of the LED lens 200, the light beams L are refracted within the predetermined beam angle about the optical axis $A_o$ while spreading in the radial directions. The range of the beam angle is determined by the configuration and refractivity of the LED lens 200.

A number of LED lenses 200 of this structure are arrayed in both sides of an LED array substantially the same as shown in FIG. 12, which is mounted on an LCD backlight apparatus. Then, light emitted from LED chips can backlight the LCD panel in a substantially same fashion as in FIG. 12.

This structure also allows one LED array to be mounted with more LED lenses and chips which are doubled compared to the foregoing prior art, thereby increasing light quantity radiated from the LED array. Accordingly, this structure can reduce the number of LED arrays, thereby simplifying the structure of the backlight apparatus.

Figure 23:
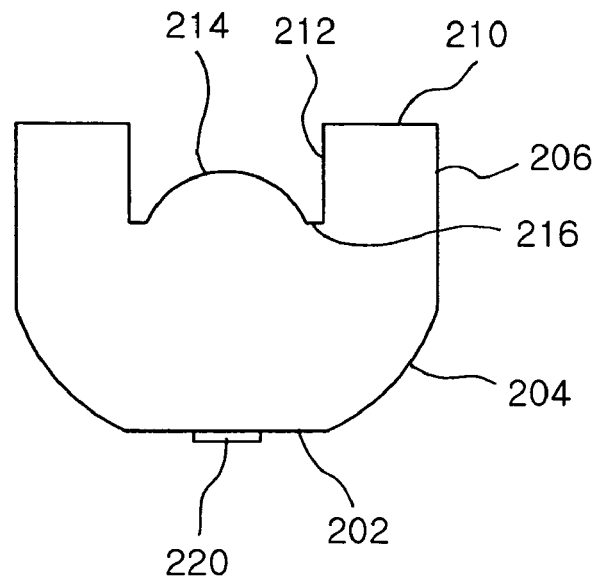
FIGS. 23 to 25 are cross-sectional views of various modifications to the LED lens according to the second embodiment of the present invention.
Figure 24:
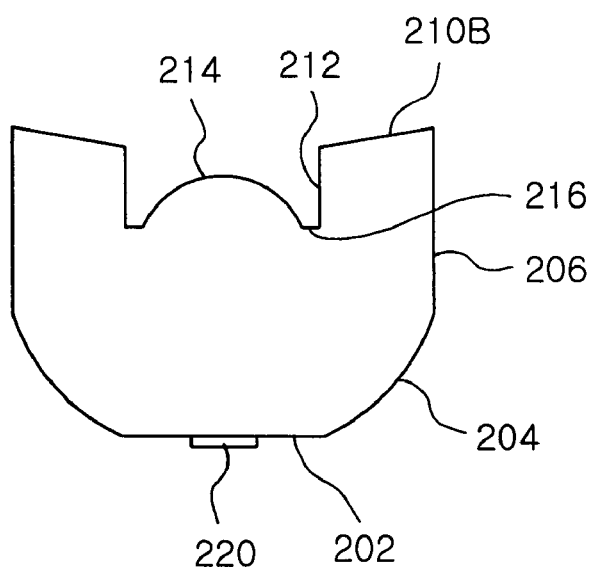
Figure 25:
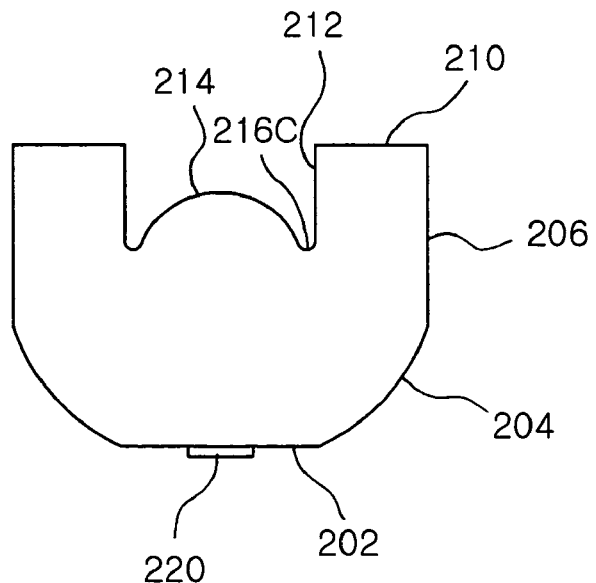

FIGS. 23 to 25 are cross-sectional views of various modifications to the LED lens according to the second embodiment of the present invention.

Referring to FIG. 23, an LED lens 200A has substantially the same structure as the afore-described LED lens 200 of the second embodiment except that connecting surfaces 216 are formed at those regions where intermediate surfaces 212 are connected with a second radiating surface 214. The connecting surfaces 216 facilitate the fabrication of a mold for forming the lens 200A.

Referring to FIG. 24, an LED diode lens 200B has substantially the same structure as the LED lens 200A in FIG. 24 except that first radiating surfaces 210B are so inclined that outer portions thereof are projected beyond inner portions thereof. The inclined first radiating surfaces 210B can focus passing light beams further toward the optical axis. The first radiating surfaces 210B have an angle preferably about 30 to 60° about intermediate surfaces 212 in FIG. 24. The inclined first radiating surfaces 210B can be applied to the LED lens 200 of the second embodiment.

Referring to FIG. 25, an LED lens 200C has curved connecting surfaces 216C formed between intermediate surfaces 212 and a second radiating surface 214. The curved connecting surfaces 216C also facilitate the fabrication of a mold for forming the lens 200C.

Figure 26:
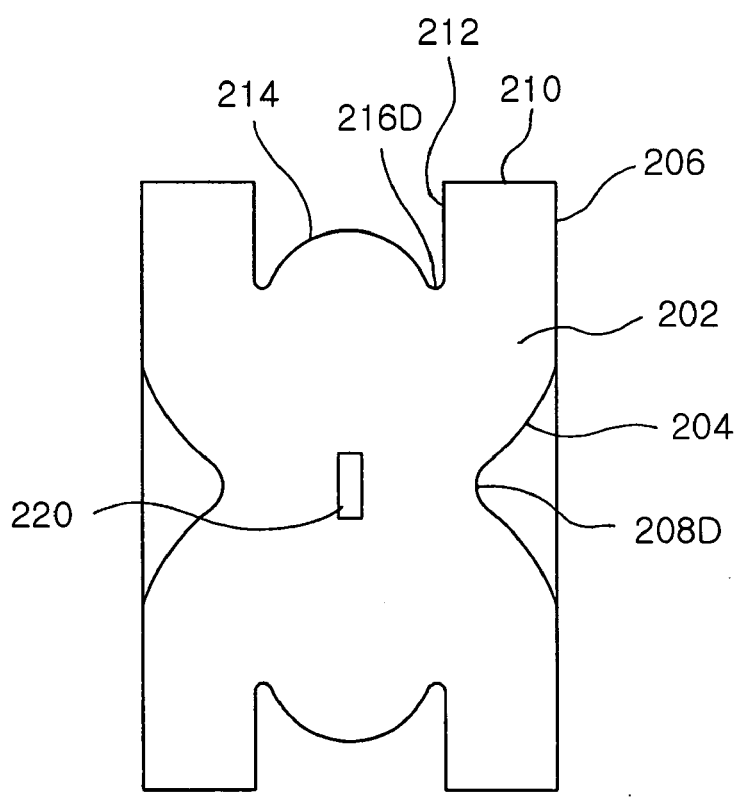
FIG. 26 is a bottom view of a still another modification to the LED lens according to the second embodiment of the present invention.

FIG. 26 is a bottom view of a still another modification to the LED lens according to the second embodiment of the present invention. Referring to FIG. 26, an LED lens 200D has a bottom configuration substantially the same as that of LED lens 200 of the second embodiment in FIG. 19 except that curved connecting portions 208D are formed around converging points of first reflecting surfaces 204 and curved connecting surfaces 216D are formed between intermediate surfaces 212 and a second radiation surface 214. The curved connecting portions 208D and surfaces 216D can further facilitate the fabrication of a mold for forming the lens 200D.

Figure 27:
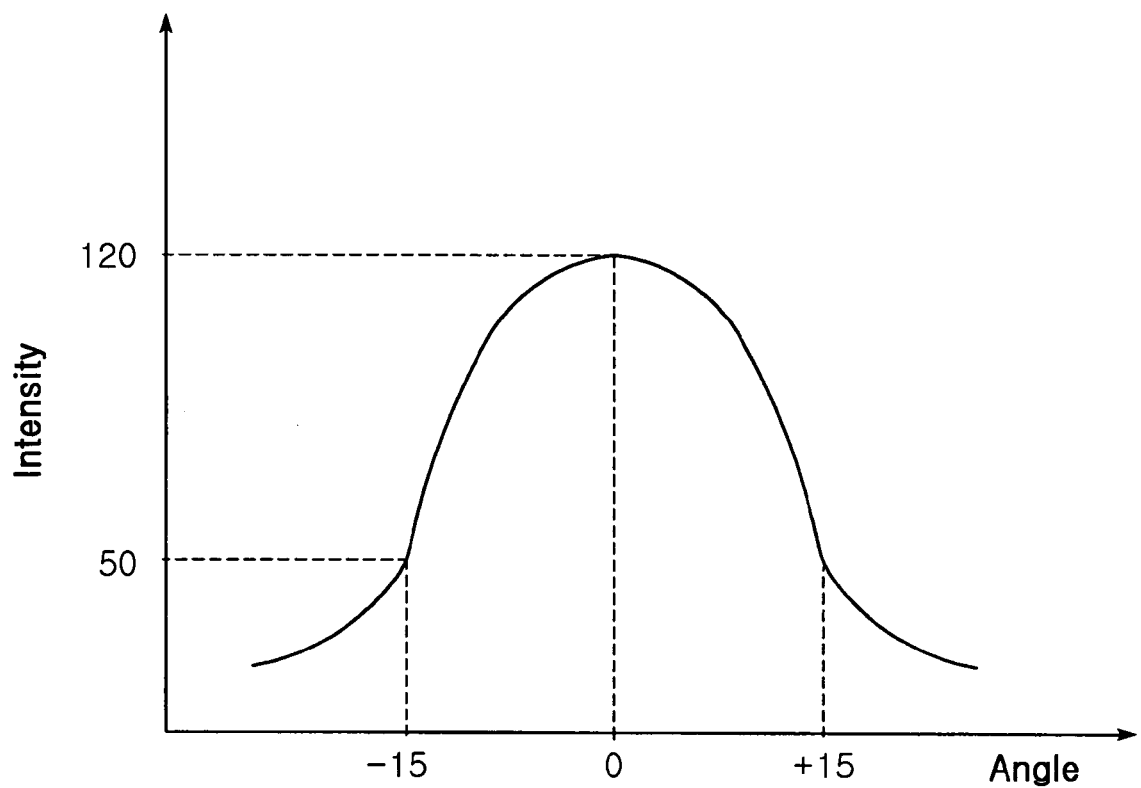
FIG. 27 is a graph illustrating the intensity of light radiated from the LED lens as shown in FIG. 26.

FIG. 27 is a graph illustrating the intensity of light beams radiated through radiating surfaces 210 and 214 of the LED lens 200D as shown in FIG. 26. In FIG. 27, the intensity of light is marked in candela according to radial angles in lateral directions of the LED lens 200D with respect to the optical axis, i.e., the normal line passing through an LED chip 220 as the light source. As can be seen from FIG. 27, radiating light is concentrated within the range of about ±15° with respect to the x-axis (of FIG. 15). The radiating light in this beam angle corresponds to about at least 70% of the entire light quantity.

The LED lens 200D of FIG. 26 was taken in this experiment, since it is easiest to realize this structure. For example, the LED lens 200 in FIGS. 15 to 20 can further enhance the efficiency.

The LED lens according to the first embodiment of the present invention are not limited to the afore-described illustrative structures 200, 200A to 200D. For example, the radiating surfaces 204 and 206 are not necessarily symmetric. In this case, the foregoing connecting points 208 or the connecting portions 208D may be formed only in one of the reflecting surfaces 204 so that the opposite one of the reflecting surfaces 110 may not be half funnel shaped. In addition, the second reflecting surfaces 206 may be inclined at a predetermined angle with respect to the optical axis $A_o$ rather than being parallel with the same. Alternatively, the second reflecting surfaces may be formed at different angles.

As described hereinbefore, the LED lens of the present invention radiates light beams generated from the LED chip to the outside in a predetermined beam angle to simplify the optical path thereby reducing optical loss.

In addition, the backlight apparatus of the present invention can double the light quantity radiated from the LED array by mounting LED lenses and chips on both sides of the array module. This can reduce the number of LED arrays and thereby simplifying the backlight apparatus structure.

While the present invention has been shown and described in connection with the preferred embodiments, it will be apparent to those skilled in the art that modifications and variations can be made without departing from the spirit and scope of the invention as defined by the appended claims.

What is claimed is:

1. A Light Emitting Diode (LED) lens for radiating light emitted from an LED chip to the outside comprising:
   a planar bottom having a pair of halves symmetrically connected with each other about a reference line, and narrowed in the vicinity of the reference line;
   a pair of substantially semicircular reflecting surfaces extended from both edges of the bottom connected with both ends of the reference line; and
   a radiating surface connected with remaining edges of the bottom and semicircular edges of the reflecting surfaces,
   wherein the reflecting surfaces reflect light beams introduced from the LED chip through the bottom toward the radiating surface, and the radiating surface radiates the light beams to the outside, the light beams being introduced to the radiating surface through reflection from the reflecting surfaces and directly through the bottom, whereby the light beams are radiated to the outside in a predetermined beam angle.

2. The LED lens according to claim 1, wherein the reflecting surfaces are curved.

3. The LED lens according to claim 1, wherein each of the reflecting surfaces includes a curved portion connected with the bottom and a planar portion connected with the radiating surface.

4. The LED lens according to claim 1, wherein the pair of reflecting surfaces are symmetric with each other.

5. The LED lens according to claim 1, wherein the pair of reflecting surface are asymmetric with each other.

6. The LED lens according to claim 1, wherein at least one of the reflecting surfaces is extended from one of the ends of the reference line into the form of a half funnel.

7. The LED lens according to claim 1, wherein the radiating surface has a cross-sectional configuration of a concave curve.

8. The LED lens according to claim 1, wherein the radiating surface comprises a pair of first linear portions connected with the reflecting surfaces, a pair of opposed second linear portions extended from the first linear portions at a predetermined angle toward the reference line and a convex portion connected with the second linear portions.

9. The LED lens according to claim 8, wherein the radiating surface further comprises linear connecting portions formed between the second linear portions and the convex portion.

10. The LED lens according to claim 8, wherein the radiating surface further comprises curved connecting portions formed between the second linear portions and the convex portion.

11. The LED lens according to claim 8, wherein the second linear portions are substantially parallel with the reference line.

12. The LED lens according to claim 8, wherein the second linear portions are inclined at a predetermined angle with respect to the reference line.

13. The LED lens according to claim 1, wherein the bottom is narrowed in the vicinity of the reference line to form a reduced diameter portion, and comprises linear portions at both ends of the reduced diameter portion.

14. The LED lens according to claim 1, wherein the bottom is narrowed in the vicinity of the reference line to form a reduced diameter portion, and comprises curved portions at both ends of the reduced diameter portion.

15. A backlight apparatus provided in a rear part of a Liquid Crystal Display (LCD) for radiating light beams perpendicularly into an LCD panel, comprising:
- a substantially box-shaped housing opened toward the LCD panel;
- a reflector inclined slowly upward within the housing; and
- a Light Emitting Diode (LED) array including a board extended across the housing and erected on the reflector and at least one LED lens attached on the board for radiating light emitted from an LED chip to the outside, wherein the LED lens comprises:
- a planar bottom having a pair of halves symmetrically connected with each other about a reference line, and narrowed in the vicinity of the reference line;
- a pair of substantially semicircular reflecting surfaces extended from both edges of the bottom connected with both ends of the reference line; and
- a radiating surface connected with remaining edges of the bottom and semicircular edges of the reflecting surfaces, wherein the reflecting surfaces reflect light beams introduced from the LED chip through the bottom toward the radiating surface, and the radiating surface radiates the light beams to the outside, the light beams being introduced to the radiating surface through reflection from the reflecting surfaces and directly through the bottom, whereby the light beams are radiated to the outside in a predetermined beam angle.

* * * * *